(12) United States Patent
Albrecht et al.

(10) Patent No.: US 9,105,295 B2
(45) Date of Patent: Aug. 11, 2015

(54) PATTERN TONE REVERSAL

(71) Applicant: HGST Netherlands B.V., Amsterdam (NL)

(72) Inventors: Thomas Albrecht, San Jose, CA (US); He Gao, San Jose, CA (US); Kanaiyalal Patel, Fremont, CA (US); Tsai-wei Wu, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 77 days.

(21) Appl. No.: 13/835,395

(22) Filed: Mar. 15, 2013

(65) Prior Publication Data
US 2014/0242341 A1 Aug. 28, 2014

Related U.S. Application Data

(60) Provisional application No. 61/769,138, filed on Feb. 25, 2013.

(51) Int. Cl.
| | |
|---|---|
| *G11B 5/84* | (2006.01) |
| *G11B 5/82* | (2006.01) |
| *H01L 21/033* | (2006.01) |
| *H01L 21/308* | (2006.01) |
| *H01L 21/311* | (2006.01) |
| *H01L 21/768* | (2006.01) |

(Continued)

(52) U.S. Cl.
CPC ............. *G11B 5/82* (2013.01); *B81C 1/0046* (2013.01); *B82Y 40/00* (2013.01); *G03F 7/0002* (2013.01); *G03F 7/0035* (2013.01); *G03F 7/094* (2013.01); *G11B 5/743* (2013.01); *G11B 5/746* (2013.01); *G11B 5/855* (2013.01); *H01L 21/0337* (2013.01); *H01L 21/3086* (2013.01); *H01L 21/31116* (2013.01); *H01L 21/31138* (2013.01); *H01L 21/31144* (2013.01); *H01L 21/76817* (2013.01); *Y10T 428/24479* (2015.01)

(58) Field of Classification Search
CPC ............. H01L 21/0337; H01L 21/3086; H01L 21/31138; H01L 21/31144; H01L 21/31116; H01L 21/76817; B82Y 40/00; G11B 5/743; G03F 7/0002; G03F 7/0035; G03F 7/094; B81C 1/0046
See application file for complete search history.

(56) References Cited

U.S. PATENT DOCUMENTS

| | | |
|---|---|---|
| 4,973,544 A | 11/1990 | Slayman et al. |
| 6,749,969 B2 | 6/2004 | Horak et al. |

(Continued)

OTHER PUBLICATIONS

H. Xiao, Introduction to Semiconductor Manufacturing Technology, published by Prentice Hall, year 2001, ISBN 0-13-022404-9, pp. 332-353).*

(Continued)

*Primary Examiner* — Lan Vinh
*Assistant Examiner* — Jiong-Ping Lu

(57) ABSTRACT

A method for patterning a substrate is disclosed. Depressions are patterned into a resist layer over a substrate. A mask layer is deposited over the resist layer at least partially filling the depressions. The mask layer is etched to expose a top surface of the resist layer and leaving at least a portion of the mask layer in the depressions of the resist layer, wherein the mask layer over said top surface of the resist layer is etched at a faster rate than said mask layer in the depressions of the resist layer. Exposed portions of the resist layer are removed to expose portions of the substrate. Exposed portions of the substrate are etched.

19 Claims, 17 Drawing Sheets

(51) Int. Cl.
- *B82Y 40/00* (2011.01)
- *G11B 5/74* (2006.01)
- *G03F 7/00* (2006.01)
- *G03F 7/09* (2006.01)
- *B81C 1/00* (2006.01)
- *G11B 5/855* (2006.01)

(56) References Cited

U.S. PATENT DOCUMENTS

| | | | |
|---|---|---|---|
| 6,881,465 B2 | 4/2005 | Ogawa et al. | |
| 7,049,241 B2 | 5/2006 | Schroeder et al. | |
| 7,186,656 B2* | 3/2007 | Sreenivasan | 438/700 |
| 7,241,395 B2 | 7/2007 | Sreenivasan et al. | |
| 7,670,953 B2 | 3/2010 | Sreenivasan | |
| 7,807,575 B2 | 10/2010 | Zhou | |
| 7,943,289 B2 | 5/2011 | Rangarajan et al. | |
| 8,198,016 B2 | 6/2012 | Hatakeyama et al. | |
| 8,333,899 B2 | 12/2012 | Sakurai et al. | |
| 2003/0026937 A1* | 2/2003 | Ogawa et al. | 428/64.4 |
| 2008/0118872 A1* | 5/2008 | Sreenivasan | 430/323 |
| 2008/0122125 A1* | 5/2008 | Zhou | 257/797 |
| 2010/0020443 A1 | 1/2010 | Albrecht et al. | |
| 2011/0226737 A1 | 9/2011 | Albrecht | |
| 2011/0235212 A1* | 9/2011 | Sakurai et al. | 360/135 |
| 2012/0126358 A1 | 5/2012 | Arnold et al. | |

OTHER PUBLICATIONS

Sreenivasan, S.V. et al., "Reverse Tone Bi-Layer Etch in UV Nanoimprint Lithography", Micro Magazine Jan./Feb. 2005. http://www.molecularimprints.com/pdf/archives/news_articles05/MICRO-Mag-Final.pdf.

* cited by examiner

PATTERN TONE REVERSAL

RELATED APPLICATIONS

This application claims priority to the provisional patent application, Ser. No. 61/769,138, entitled "PATTERN TONE REVERSAL," with filing date Feb. 25, 2013, and assigned to the assignee of the present invention, which is herein incorporated by reference in its entirety.

BACKGROUND ART

A hard disk drive (HDD) may be used by a computer system for operations. In fact, most computing systems are not operational without some type of data storage such as a HDD to store the most basic computing information such as the boot operation, the operating system, the applications, and the like. In general, the HDD is a component for use in a computer system or may be used as a component of dedicated remote data storage systems for use in cloud computing. A HDD often uses a media or substrate such as a hard disk. The hard disk may be patterned with a structure useful in normal read and write operations of the HDD.

DESCRIPTION OF EMBODIMENTS

Figure 1:
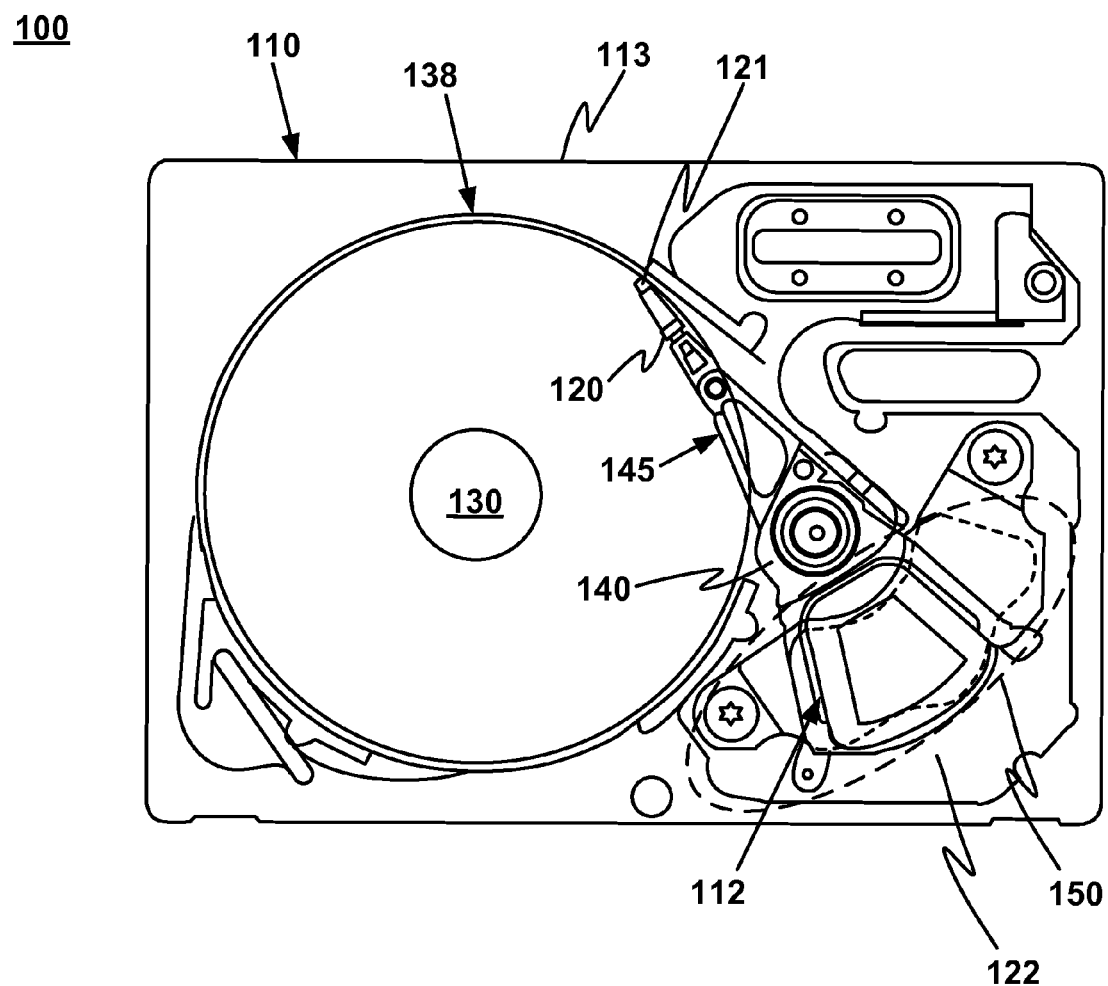
FIG. 1 is a schematic diagram of an HDD in accordance with embodiments of the present invention.

Reference will now be made in detail to various embodiments of the present invention. While the invention will be described in conjunction with these embodiments, it should be understood that the described embodiments are not intended to limit the invention to these embodiments. On the contrary, the invention is intended to cover alternatives, modifications and equivalents, which may be included within the spirit and scope of the invention as described in the various embodiments and as defined by the appended claims.

Furthermore, in the following description of embodiments, numerous specific details are set forth in order to provide a thorough understanding of various embodiments of the present invention. However, it will be recognized by one of ordinary skill in the art that embodiments of the present invention may be practiced without these specific details. In other instances, well known methods, procedures, components, and circuits have not been described in detail as not to unnecessarily obscure aspects of embodiments of the present invention.

Overview of Discussion

The discussion will begin with a brief overview of the present invention. The discussion will then focus on a hard disk drive (HDD) and components connected therewith. The discussion will then focus on embodiments of pattern tone reversal.

In particular, the present technology is for patterning a substrate or one or more thin films on a substrate using techniques such as pattern tone reversal. The present technology is also for high-throughput production, compatible with bit pattern media (BPM) disk manufacturing schemes, without the need for breaking vacuum. The substrate may be a media such as a disk in a HDD. The patterning may occur on both sides of a disk and may occur on more than one disk in a HDD. The patterning may be useful in a HDD for reading and writing data to the disk and other normal HDD operations.

In one embodiment, the processes of the present technology involve initial resist patterning, a collimated deposition of a desired mask material, and an etch back using RIE. In various embodiments, the present technology does not require thick material deposition, complete hole filling, or planarization. It also offers etch selectivity between the mask material and underlying layers In one embodiment, a resist layer is disposed over the surface of a substrate. Then a technique is employed to pattern depressions into the resist. A wide variety of techniques may be employed to pattern the depressions into the resist. The depression may be in a variety of shapes and/or sizes such as holes or trenches. The depressions may comprise sidewalls that are perpendicular to the surface of the substrate or may be at an angle. In one embodiment, a plurality of depressions are patterned into the resist layer that are substantially uniform one to another. When the depressions are formed, a top surface of the resist layer is left with the depression penetrating through the top layer.

In one embodiment, a mask layer is deposited over the resist layer. The mask layer may be disposed over the top surface of the resist layer as well as partially fill in the depressions in the resist layer. The mask layer may also cover the sidewalls of the depressions. In one embodiment, the thickness of the mask layer over the top surface is substantially the same as the thickness of the mask layer filling the depressions.

In one embodiment, the mask layer is then etched. The etching may remove the mask layer from the top surface of the resist layer to expose the top surface of the resist layer. The etching leaves a portion of the mask layer partially filling the depression in the resist layer. The etching may also remove portions of the mask layer from portions of the sidewalls of the depressions. The mask layer may be composed from a variety of different materials.

The etching may occur over the entire surface of the mask layer. However, the etching may occur at different rates over different portions of the mask layer. In particular, because of a local depletion of reactive species and accumulation of etching products in the depressions, the etching may occur faster over the top surface of the resist layer, but slower over the mask layer partially filling the depressions in the resist layer, an effect that may be referred to as the microloading effect. Thus, once the etching has removed the mask layer from the top surface of the resist layer, a portion of the mask layer remains to partially fill the depressions.

In one embodiment, after the etching, the exposed portions of the resist layer are then removed to expose portions of the substrate. However, portions of the mask remain in the depressions of the resist layer that continue to cover portions of the substrate. A residual layer of resist may remain under the remaining portions of the mask.

In one embodiment, the exposed portions of the substrate are then etched. The result is that the portions of the substrate covered by the mask that partially filled the depressions of the resist layer now protrude from the etched surface of the substrate. Thus a pattern is formed on the substrate using a pattern tone reversal technique.

Operation

The basic HDD model includes a magnetic storage disk, hard disk, or media that spins at a designed rotational speed. The media may be patterned using the present technology. An actuator arm with a suspended slider is utilized to reach out over the disk. The slider may comprise one or more magnetic read and write transducers or heads for reading and writing information to or from a location on the disk. The slider may also comprise a heater coil designed to change shape when heat is transferred to the heater coil by means of electric current. The slider is mounted on a suspension which connects to the actuator arm. In the case of multiple platter drives, there can be multiple suspensions attaching to multiple actuator arms as components of a head stack assembly. The head stack assembly also includes a voice coil which is part of a motor used for moving the arms to a desired location on the disk(s).

With reference now to FIG. 1, a schematic drawing of one embodiment of an information storage system including a magnetic hard disk file or HDD 110 for a computer system is shown, although only one head and one disk surface combination are shown. What is described herein for one head-disk combination is also applicable to multiple head-disk combinations. In other words, embodiments of the present technology are independent of the number of head-disk combinations. FIG. 1 represents an information storage device that is in accordance with embodiments of the present technology for measuring variations in the head-disk clearance of a HDD.

In general, HDD 110 has an outer housing 113 usually including a base portion (shown) and a top or cover (not shown). In one embodiment, housing 113 contains a disk pack having at least one media or magnetic disk 138. The disk pack (as represented by disk 138) defines an axis of rotation and a radial direction relative to the axis in which the disk pack is rotatable.

A spindle motor assembly having a central drive hub 130 operates as the axis and rotates the disk 138 or disks of the disk pack in the radial direction relative to housing 113. An actuator assembly 140 includes one or more actuator arms 145. When a number of actuator arms 145 are present, they are usually represented in the form of a comb that is movably or pivotally mounted to base/housing 113. An actuator arm controller 150 is also mounted to base 113 for selectively moving the actuator arms 145 relative to the disk 138. Actuator assembly 140 may be coupled with a connector assembly, such as a flex cable to convey data between arm electronics and a host system, such as a computer, wherein HDD 110 resides.

In one embodiment, each actuator arm 145 has extending from it at least one cantilevered integrated lead suspension (ILS) 120. The ILS 120 may be any form of lead suspension that can be used in a data access storage device. The level of integration containing the slider 121, ILS 120, and read and write head is called the head stack assembly.

The ILS 120 has a spring-like quality, which biases or presses the air-bearing surface of slider 121 against disk 138 to cause slider 121 to fly at a precise distance from disk 138. Slider 121 may have a pole tip which protrudes at various lengths from slider 121. Slider 121 may also contain a read head, a write head and a heater coil. ILS 120 has a hinge area that provides for the spring-like quality, and a flexing cable-type interconnect that supports read and write traces and electrical connections through the hinge area. A voice coil 112, free to move within a conventional voice coil motor magnet assembly is also mounted to actuator arms 145 opposite the head stack assemblies. Movement of the actuator assembly 140 causes the head stack assembly to move along radial arcs across tracks on the surface of disk 138. In one embodiment, actuator arm controller 150 controls a plurality of actuator arms associated with a plurality of disks.

Figure 2A:
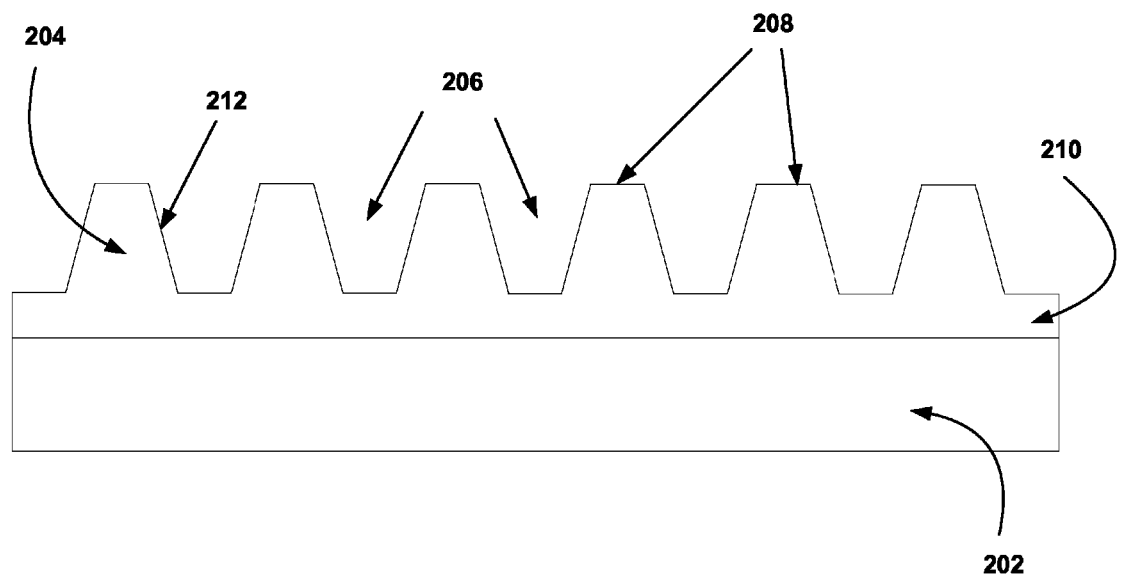
FIG. 2A is a schematic diagram of a substrate with a resist layer in accordance with embodiments of the present invention.

Reference will now be made to FIG. 2A, a schematic diagram of a cross sectional view of a substrate with a resist layer in accordance with embodiments of the present invention. Substrate 202 may be a substrate or a media upon which patterning is desired. The media may be a disk for use in a HDD. Resist layer 204 is depicted in FIG. 2A over substrate 202 after it has been patterned. In one embodiment, resist layer 204 is patterned to create depressions 206 that penetrate through top surface 208. It should be appreciated that top surface 208 is a planar surface that faces away from substrate 202. Depressions 206 are depicted as being uniform to one another; however, the depressions need not be uniform and can take on any shape or size. In one embodiment, the depressions are holes or trenches in resist layer 204. In one embodiment, the depressions are formed into the resist layer 204 as opposed to protrusions or columns being formed in the resist layer. In one embodiment, substrate 202 is comprised of multiple layers as is described below in FIG. 8.

Depressions 206 are also depicted as having sidewalls such as sidewall 212. Sidewall 212 may protrude perpendicular to top surface 208 as well as perpendicular to the surface of substrate 202 that is in contact with resist layer 204. In one embodiment, the sidewall angles of the pattern, with respect to the substrate, are greater than sixty degrees.

It should be appreciated that resist layer 204 may be patterned using a variety of techniques such as, photon-based lithography, nano-imprint lithography, electron beam lithography, or block copolymer self-assembly. In one embodiment, there is a minimum lateral dimension of depressions 206 between 5 nanometers (nm) and 50 nm. In one embodiment, the pattern depth in resist layer 204 is between 10 nm and 50 nm.

Depressions 206 may penetrate through resist layer 204 to expose a small portion of substrate 202. In one embodiment, depressions 206 do not penetrate all the way through resist layer 204 and a residual layer of the resist layer is left between the depression and the substrate. This residual layer is depicted by residual layer 210 in FIG. 2A. In one embodiment, residual layer 210 is less than 10 nm. In one embodiment, the resist patterning may include a descum step.

Figure 2B:
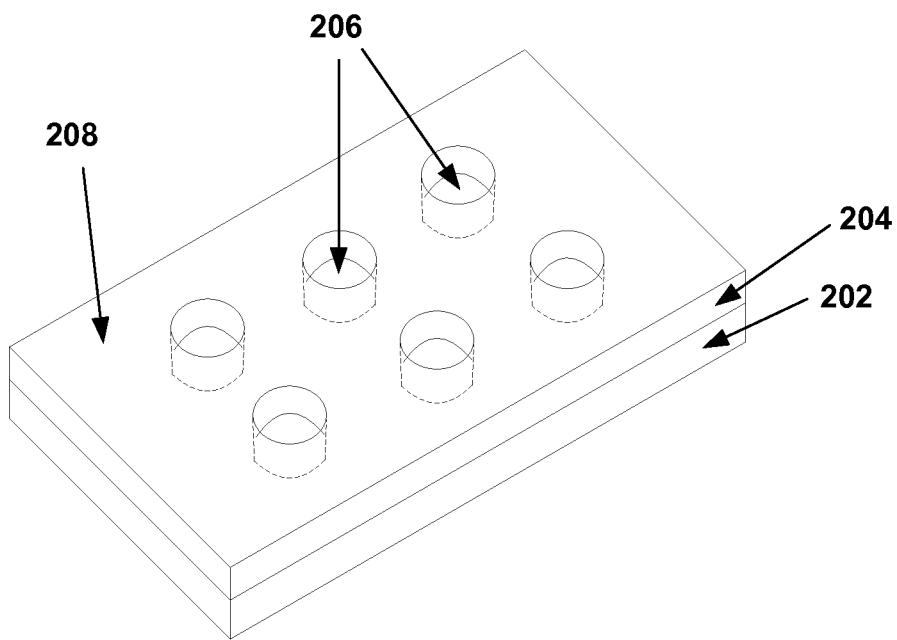
FIG. 2B is a schematic diagram of a substrate with a resist layer in accordance with embodiments of the present invention.

Reference will now be made to FIG. 2B, a schematic diagram of a three dimensional view of a substrate with a resist layer in accordance with embodiments of the present invention. It should be appreciated that FIGS. 2A and 2B depict substrate 202 and resist layer 204 in the same stage of patterning. Depressions 206 of FIG. 2B depict the depressions as cylindrical holes; however the depression may be of any size or shape and may have sidewalls at various angles. Top surface 208 depicts the same top surface 208 as in FIG. 2A.

Figure 3:
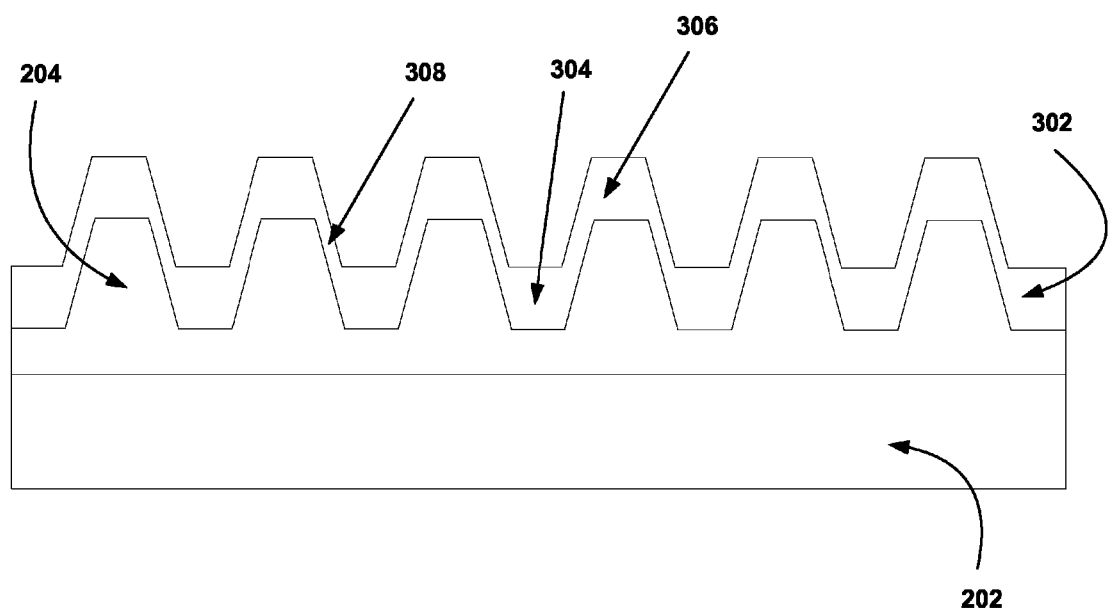
FIG. 3 is a schematic diagram of a substrate with a resist layer and a mask layer in accordance with embodiments of the present invention.

Reference will now be made to FIG. 3, a schematic diagram of a cross sectional view of substrate 202 with resist layer 204 in accordance with embodiments of the present invention. It should be appreciated that substrate 202 and resist layer 204 are depicted in FIG. 3 at a later processing step than what is depicted in FIGS. 2A and 2B. In FIG. 3, mask layer 302 is deposited over resist layer 204. In one embodiment, mask layer 302 is deposited collimated. In one embodiment, mask layer 302 is deposited in a direction generally perpendicular to the surface of substrate 202 that is in contact with resist layer 204. It should be appreciated that the deposition of mask layer 302 is not limited to any one type of deposition and may be a collimated or non-collimated. FIG. 3 depicts mask layer 302 as being deposited over the entire surface of resist layer 204. 304 depicts mask layer 302 as partially filling a depression in the resist layer 204. In other words, mask layer 302 does not fill the depression up to top surface 208, but rather is filled partially up sidewall 212. 306 depicts mask layer 302 as covering top surface 208 of the resist layer 204. 308 depicts mask layer 302 as covering sidewall 212 of the resist layer 204. In one embodiment, the thickness of mask layer 302 at 304 and 306 are substantially the same thickness. However, the thickness at 304 and 306 need not be the same. Moreover, the thickness 308 of the mask over sidewall 212 may or may not be the same as 306 or 304.

In one embodiment, mask layer 302 is a reactive ion etchable (RIE) mask. In one embodiment, mask layer 302 is etchable by a chlorine based RIE such as $Cl_2$, $BCl_3$. In one embodiment, mask layer 302 is etchable by a fluorine based RIE such as $CF_4$, $CHF_3$, or $SF_6$. In one embodiment, mask layer 302 is etchable by a methanol based RIE. In one embodiment, mask layer 302 is etchable by ion milling or physical sputtering.

It should be appreciated that mask layer 302 may be comprised of any number of materials such as Cr, Al, Ni, Co, Pt, Ta, Ti, Mo, W, Fe and alloys thereof, Si, oxides of Cr, Ta, Ti, Al, Hf, or Si, and nitrides of Cr, Ta, Ti, Al, or Si. In one embodiment, the thickness of mask layer 302 between 2 nm and 10 nm. In one embodiment, mask layer 302 is deposited using sputtering, ion beam deposition, or evaporation.

Figure 4A:
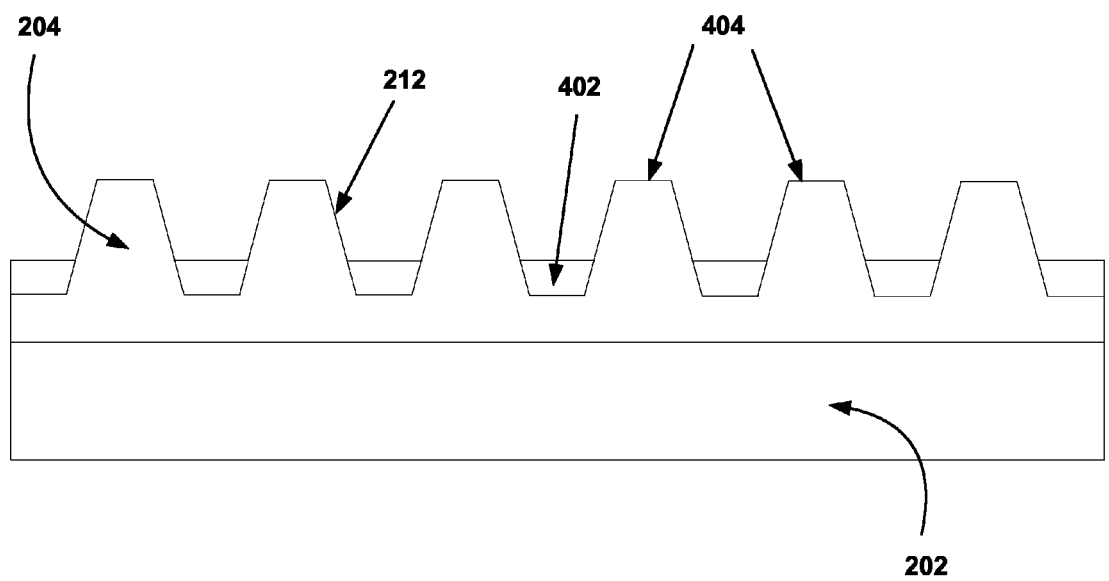
FIG. 4A is a schematic diagram of a substrate with a resist layer and a mask layer in accordance with embodiments of the present invention.

Reference will now be made to FIG. 4A, a schematic diagram of a cross sectional view of substrate 202 with resist layer 204 in accordance with embodiments of the present invention. It should be appreciated that substrate 202 and resist layer 204 are depicted in FIG. 4A at a later processing step than what is depicted in FIGS. 2A, 2B, and 3. FIG. 4A depicts mask layer 302 of FIG. 3 after it has been etched back to expose top surface 404 of resist layer 204. It should be appreciated that top surface 208 of FIGS. 2A and 2B is the same as top surface 404, only top surface 404 depicts the top surface of resist layer 204 after it has been covered and then uncovered with a mask layer. FIG. 4A also depicts a portion of sidewall 212 exposed after it has had a portion of 308 of mask layer 302 etched off.

Thickness 402 depicts a portion of mask layer 302 remaining after a portion of mask layer 302 has been etched away. For example, 304 of FIG. 3 depicts a thickness of mask layer 302 that partially fills a depression of the resist layer 204. During the etching of mask layer 302, a portion of the thickness 304 is etched away leaving thickness 402 of mask layer 302. Thickness 402 partially fills a depression of resist layer 204 at a thickness less than thickness 304. In other words, a process step occurs between FIGS. 3 and 4 which etches back the mask material using RIE to removal all materials on the top of the resist while leaving some mask material in the depressions. In one embodiment, FIG. 4A depicts the results of a dry lift off etch.

Removing all of the mask layer on top surface 404 while leaving a portion of the mask layer in the depressions may be accomplished in one step by etching the mask layer faster outside of the depressions while simultaneously etching the mask layer in the depressions at a slower rate. This difference in rates of etchings is caused by a local depletion of reactive species and accumulation of etching products which slow down the etch rate in the depression, an effect called microloading. This etching or etch back can be a chlorine based RIE such as Cl2 or BCl3, a fluorine based RIE such as CF4, CHF3, or SF6, a methanol based RIE, ion milling, or physical sputter etching.

An alternate technique may employ angled ion beam etching or angled reactive ion beam etching. Such techniques may rely on shadowing. Shadowing techniques may result in the etching species coming in at an angle where it cannot reach the bottom of the depressions and thereby does not leave mask material there. Such an alternate technique may employ a collimated beam coming in at an angle relative to normal, often at quite a steep angle, or a grazing angle. The present technology does not rely on the etching species coming in at an angle and overcomes the limitations of shadowing by allowing some mask material to remain in the depressions after removing the mask from the top. This is described as the microloading effect. Shadowing may also require specialized equipment which is more expensive and not widely produced or used. The present technology uses readily available reactive ion etching equipment which generates a plasma of reactive species, which is common and relatively inexpensive. The present technology may also approach the surface to be etched along a generally perpendicular path. The approach may or may not be collimated and may also be over a range of angles, more or less centered on perpendicular.

Figure 4B:
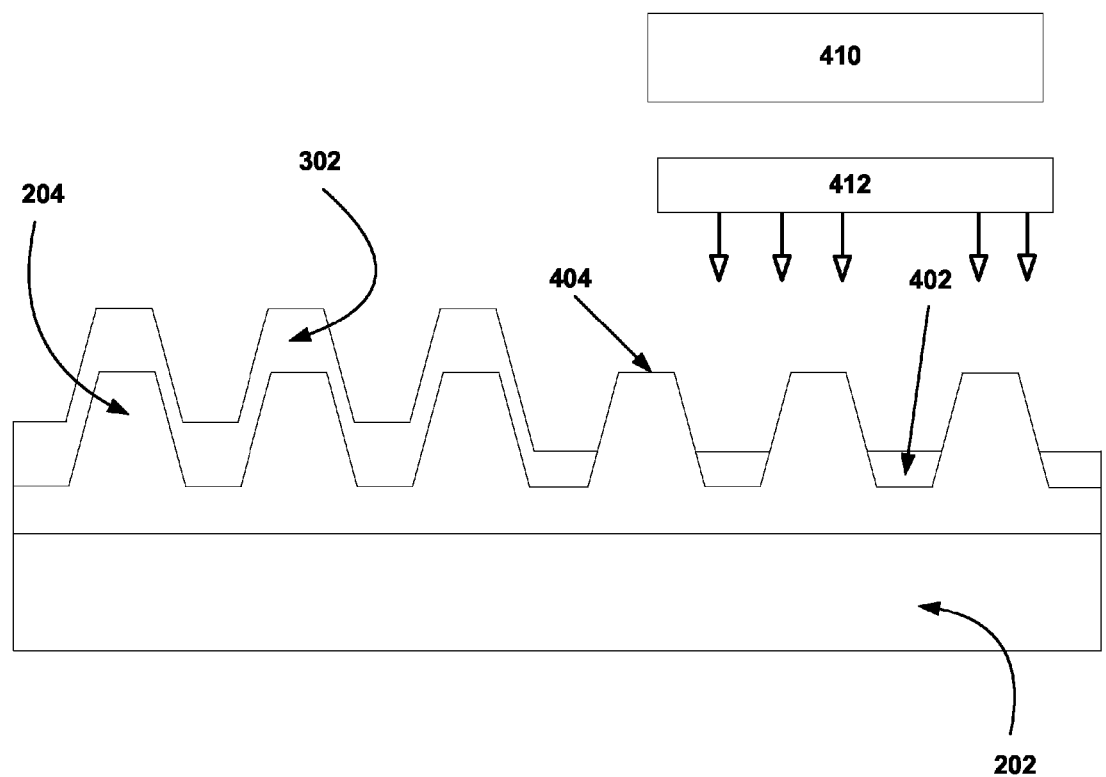
FIG. 4B is a schematic diagram of a substrate with a resist layer and a mask layer in accordance with embodiments of the present invention.

Reference will now be made to FIG. 4B, a schematic diagram of a cross sectional view of substrate 202 with resist layer 204 and mask layer 302 in accordance with embodiments of the present invention. It should be appreciated that substrate 202, resist layer 204 and mask layer 302 are depicted in FIG. 4B at a processing step that is in between what is depicted in FIGS. 3 and 4A. In other words, FIG. 4B depicts substrate 202 with resist layer 204 part way through etching mask layer 302 where the end result would be what is depicted in FIG. 4A.

In one embodiment, source 410 is the source of etching species 412. Source 410 and etching species 412 may be equipment and etching species described in reference to FIG. 4A. For example, source 410 may be reactive ion etching equipment and etching species 412 may be a plasma of a reactive species that emits from source 410. In one embodiment, source 410 comprises a plate with a surface that is substantially parallel to top surface 404. In one embodiment etching species 412 travels away from source 410 in a directional manner. In one embodiment, etching species 412 travels away from source 410 in a direction that is substantially perpendicular to top surface 412 and the surface of the plate of source 410. In one embodiment, etching species 412 travels away from source 410 in a range of directions that are centered on a perpendicular direction to top surface 412 and the surface of the plate of source 410. Such a range may only deviate a few degrees from the perpendicular direction. A perpendicular direction or a direction nearly perpendicular ensures that the etching species contacts exposed surfaces of mask layer 302 without any shadowing effect that may occur with angled etching. In one embodiment, source 410 is positioned so that the etching species travels in a direction that is substantially perpendicular to the top surface of said resist layer.

Figure 5:
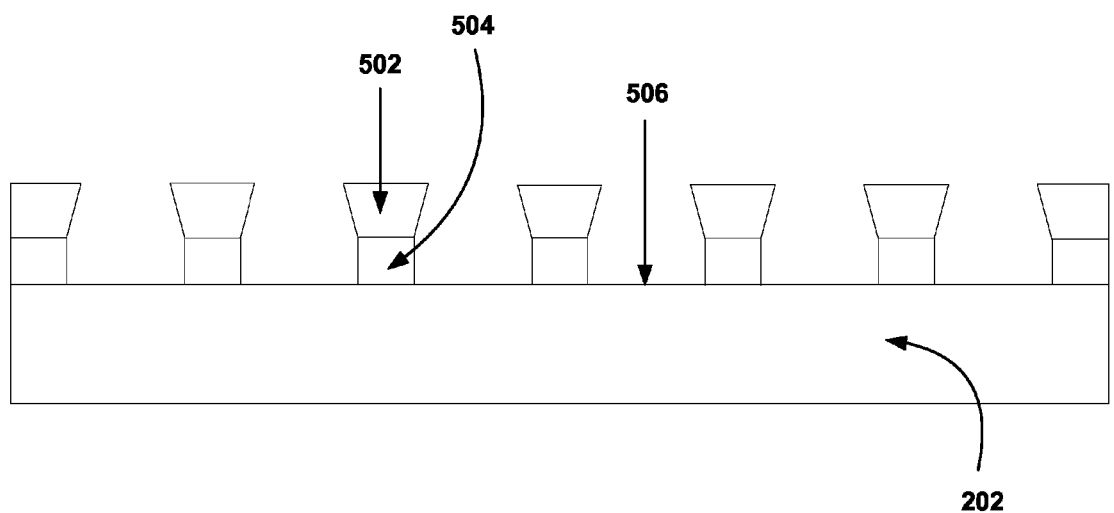
FIG. 5 is a schematic diagram of a substrate with a resist layer and a mask layer in accordance with embodiments of the present invention.

Reference will now be made to FIG. 5, a schematic diagram of a cross sectional view of substrate 202 in accordance with embodiments of the present invention. It should be appreciated that substrate 202 is depicted in FIG. 5 at a later processing step than what is depicted in FIGS. 2A, 2B, 3, and 4. FIG. 5 depicts substrate 202 after the exposed portions of resist layer 204 have been removed. For example, in FIG. 4A, top surface 404 is a portion of resist layer 204 that is exposed or not masked by thickness 402 of masking layer 302. During a processing step that occurs after what is depicted in FIG. 4A, exposed portions of the resist layer 204 are removed beginning at top surface 404 down to the surface 506 of substrate 202. Thus portions of mask layer 302 may remain covering portions of substrate 202. For example, mask portion 502 depicts a portion of what was mask layer 302 in FIG. 3 and what was thickness 402 in FIG. 4A. In one embodiment, the exposed resist layer is removed using an oxygen based RIE, a CO2 based RIE, a CO based RIE, or an H2 and Ar based RIE.

Mask portion 502 is depicted as being substantially trapezoidal in shape due to an embodiment where sidewall 212 was formed at an angle to substrate 202. However, mask portion 502 may be formed in any number of shapes. In one embodiment, a portion of mask portion 502 is wider at the top then the bottom. FIG. 5 depicts how in such an embodiment the resist layer may be removed such that it undercuts the top portion of mask portion 502. In one embodiment, resist portion 504 of resist layer 204 remains under mask portion 502. Resist portion 504 is a remaining portion of residual layer 210 of FIG. 2 and was not removed during the removal of exposed portions of the resist because it was covered with mask portion 502. In one embodiment, the present technology does not include resist portion 502 because there was no residual layer 210 and mask portion 502 would be in direct contact with substrate 202.

Figure 6A:
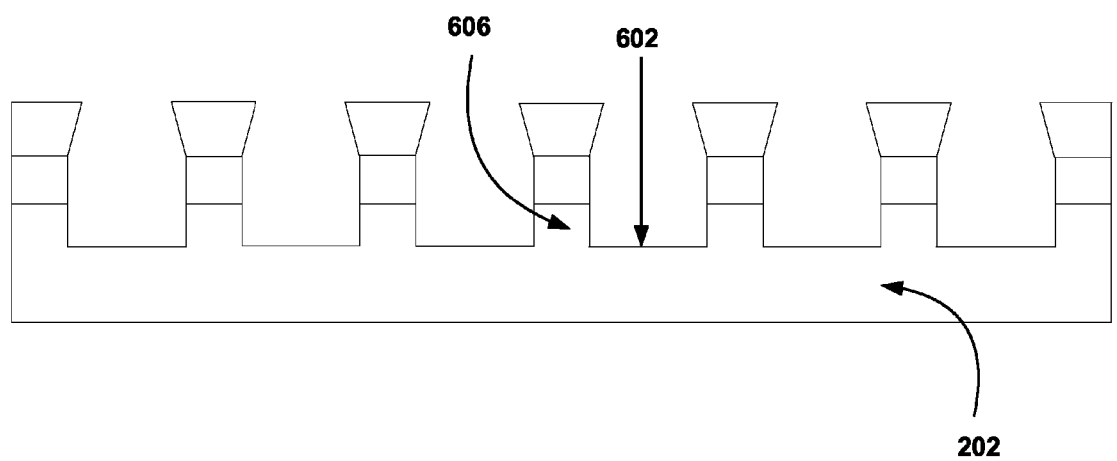
FIG. 6A is a schematic diagram of a substrate with a resist layer and a mask layer in accordance with embodiments of the present invention.

Reference will now be made to FIG. 6A, a schematic diagram of a cross sectional view of substrate 202 in accordance with embodiments of the present invention. It should be appreciated that substrate 202 is depicted in FIG. 6A at a later processing step than what is depicted in FIGS. 2A, 2B, 3, 4, and 5. FIG. 6A depicts substrate 202 after the exposed portions of substrate 202 have been etched. In FIG. 5, surface 506 of substrate 202 depicts an example of an exposed surface of substrate 202 after the exposed portions of the resist layer have been removed. During a processing step that occurs after what is depicted in FIG. 5, exposed portions of substrate 202 are etched to remove a portion of substrate 202. For example, surface 506 depicted in FIG. 5 is etched to create surface 602 of substrate 202. In other words the mask protects portions of the substrate from being etched. The result is that portions of substrate 202 will protrude from surface 506. Such a protrusion is depicted as protrusion 606.

Figure 6B:
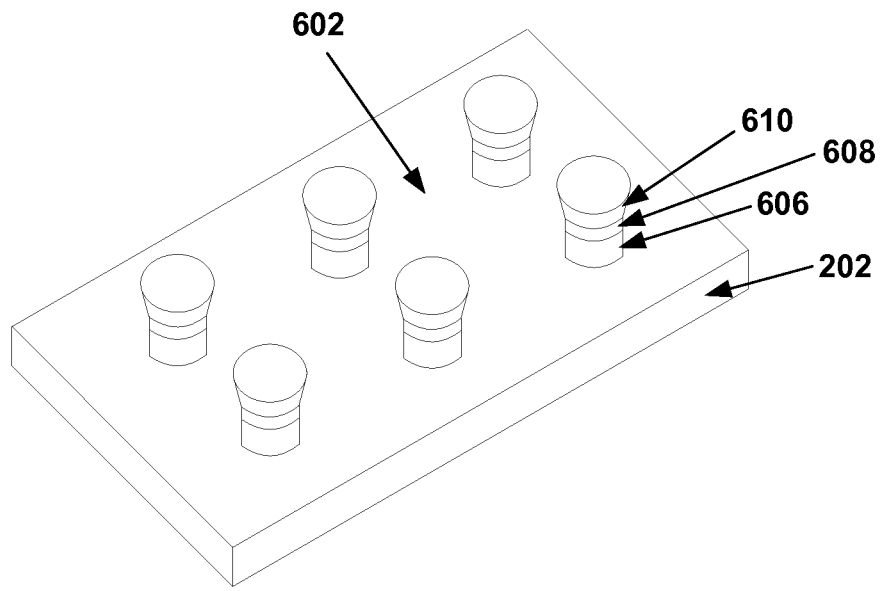
FIG. 6B is a schematic diagram of a substrate with a resist layer and a mask layer in accordance with embodiments of the present invention.

Reference will now be made to FIG. 6B, a schematic diagram of a three dimensional view of a substrate with a resist layer in accordance with embodiments of the present invention. It should be appreciated that FIGS. 6A and 6B depict substrate 202 in the same stage of processing. FIG. 6B depicts protrusion 606 protruding from surface 602 of substrate 202 after the exposed portions of substrate 202 have been etched. FIG. 6B depicts protrusion 606 as round in shape; however, protrusion 606 could take on any shape such as rectangular or elliptical. Mask portion 610 and resist portion 608 are the same as mask portion 502 and resist portion 504 in FIG. 5. In one embodiment, mask portion 610 and resist portion 608 may be removed from protrusion 606 after the exposed portions of the substrate have been etched. It should be appreciated that substrate 202 may comprise collective layers of hard masks, sacrificial materials, active device materials, or magnetic recording materials on a disk or a wafer.

Figure 7:
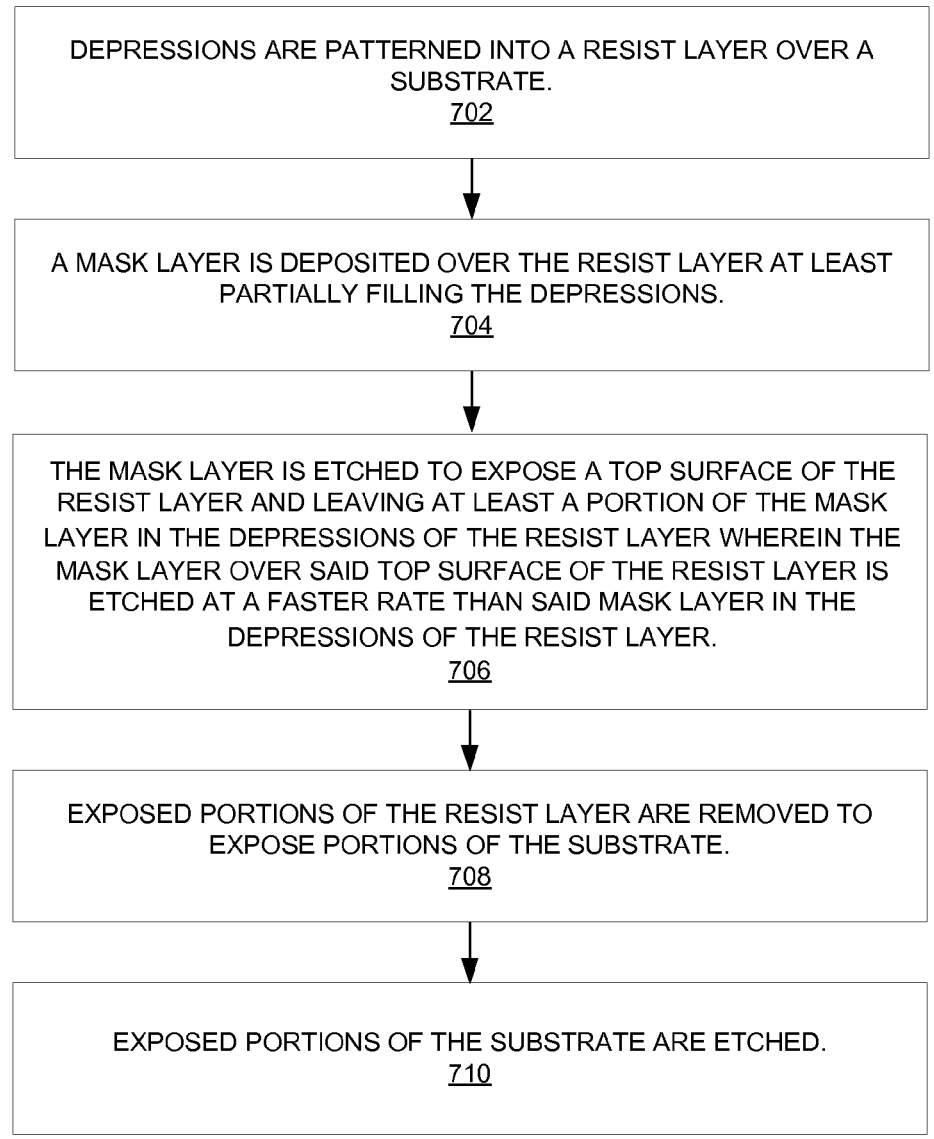
FIG. 7 is a flow chart of a method for patterning a substrate in accordance with embodiments of the present invention.

FIG. 7 is a flowchart illustrating process 700 for patterning a substrate, in accordance with one embodiment of the present technology. Process 700 and it steps are depicted in FIGS. 2A, 2B, 3, 4A, 4B, 5, 6A, and 6B. The substrate patterned by Process 700 may be a media such as a disk in a HDD such as the HDD depicted in FIG. 1.

At 702, depressions are patterned into a resist layer over a substrate. For example, the substrate may be substrate 202 and the resist layer may be resist layer 204 of FIG. 2A. FIG. 2A depicts one embodiment of the patterned resist layer after step 702 has occurred.

At 704, a mask layer is deposited over the resist layer at least partially filling the depressions. The mask layer may be mask layer 302 of FIG. 3. FIG. 3 depicts one embodiment after step 704 has occurred.

At 706, the mask layer is etched to expose a top surface of the resist layer and leaving at least a portion of the mask layer in the depressions of the resist layer, wherein the mask layer over said top surface of the resist layer is etched at a faster rate than said mask layer in the depressions of the resist layer. In one embodiment, FIG. 4A depicts the top surface of the resist layer at top surface 404 and the portion of the mask layer in the depressions at thickness 402. FIG. 4A depicts one embodiment after step 706 has occurred. In one embodiment, the mask layer etched is via an etching species emitted from a source traveling in a direction that is substantially perpendicular to the top surface of the resist layer and substantially perpendicular to a surface of said source.

At 708, exposed portions of the resist layer are removed to expose portions of the substrate. In one embodiment, FIG. 5 depicts surface 506 as the exposed portions of the substrate. FIG. 5 depicts one embodiment after step 708 has occurred.

At 710, exposed portions of the substrate are etched. In one embodiment, FIGS. 6A and B depict surface 602 as the etched portions of the exposed substrate. FIGS. 6A and B depict one embodiment after step 710 has occurred.

Figure 8:
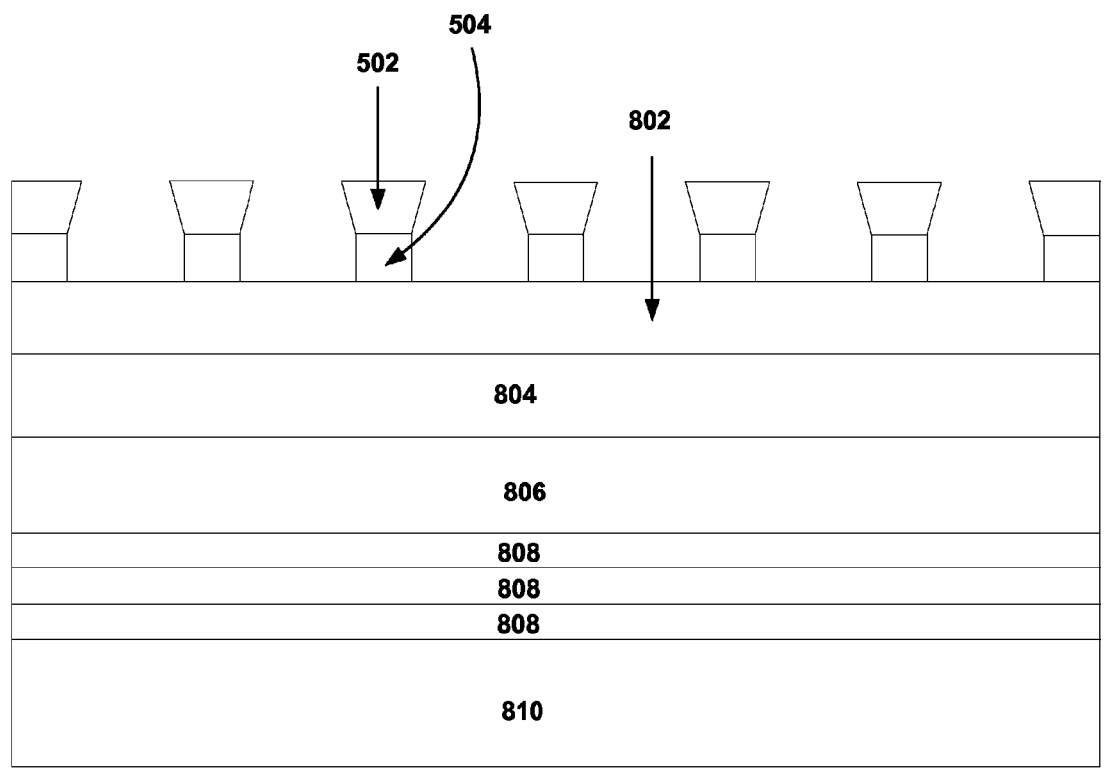
FIG. 8 is a schematic diagram of a disk in a manufacturing process in accordance with embodiments of the present invention.

Reference will now be made to FIG. 8, a block diagram of a cross sectional view of a disk in a manufacturing process in accordance with embodiments of the present invention. In one embodiment, FIG. 8 depicts a disk at a process step which is at the same process step as depicted by substrate 202 in FIG. 5. For example, substrate 202 may be a disk for use in a hard disk drive and may comprise an optional transfer layer 802 over hard mask layer 804 over magnetic media 806 over various under layers 808 over disk substrate 810. In one embodiment, resist layer 204 depicted in other figures would be over transfer layer 802 and may or may not be in contact with transfer layer 802.

In one embodiment, the optional transfer layer 802 is composed of silicon nitride. In one embodiment, transfer layer 802 is approximately 5 nm.

In one embodiment, hard mask layer 804 is composed of carbon. In one embodiment, hard mask layer 804 may be described as diamond like carbon. In one embodiment, hard mask layer 804 is 15-20 nm.

In one embodiment, magnetic media 806 may be referred to as a thin film media and is composed of a material that is capable of having data written to and read from. In one embodiment, magnetic media 806 comprises a plurality of layers of magnetic media. In one embodiment, magnetic media 806 is composed of a cobalt platinum chromium alloy.

In one embodiment, various under layers 808 comprise a plurality of under layers.

In one embodiment, disk substrate 810 is composed of glass or aluminum alloy.

Figure 9:
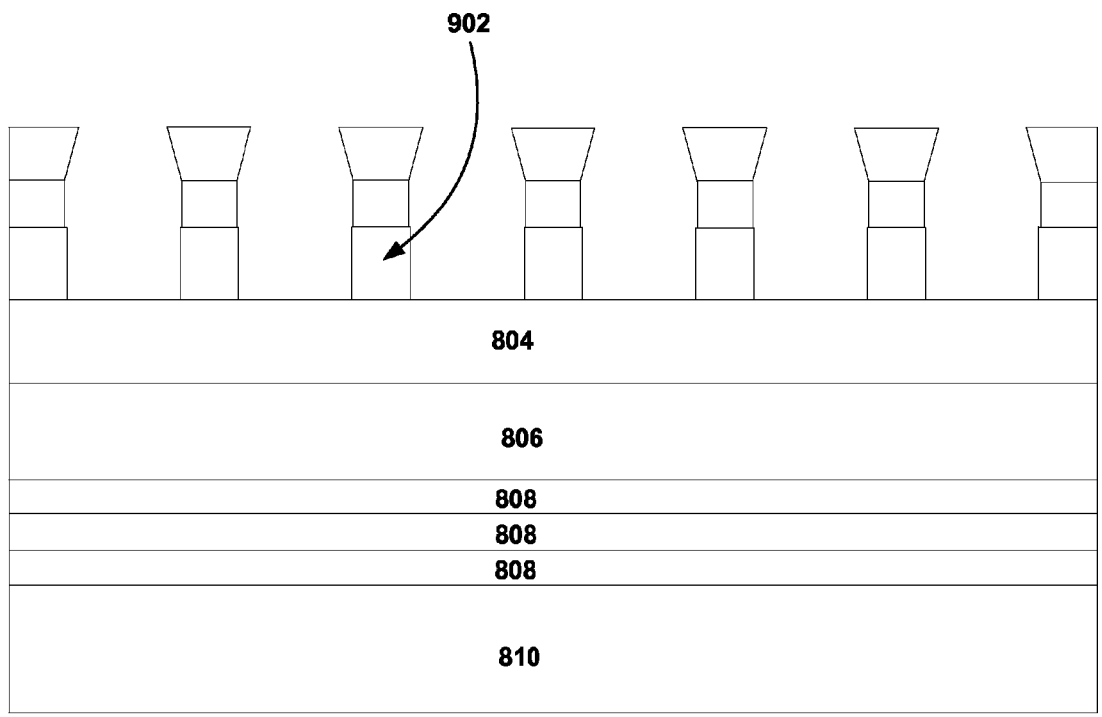
FIG. 9 is a schematic diagram of a disk in a manufacturing process in accordance with embodiments of the present invention.

Reference will now be made to FIG. 9, a schematic diagram of a cross sectional view of a disk in a manufacturing process in accordance with embodiments of the present invention. It should be appreciated that the disk in FIG. 9 is depicted at a later processing step than what is depicted in FIG. 8. FIG. 9 depicts transfer layer 802 after it has been etched. In one embodiment, transfer layer 802 is etched with a fluorine based RIE. In one embodiment, only portions of transfer layer 802 that are exposed are etched all the way through transfer layer 802 to expose portions of hard mask layer 804. For example, portions of transfer layer 802 that are covered by 502 and 504, such as remaining portion 902, are not etched. If the optional transfer layer 802 has not been included as a layer on the disk, this processing step can be skipped.

Figure 10:
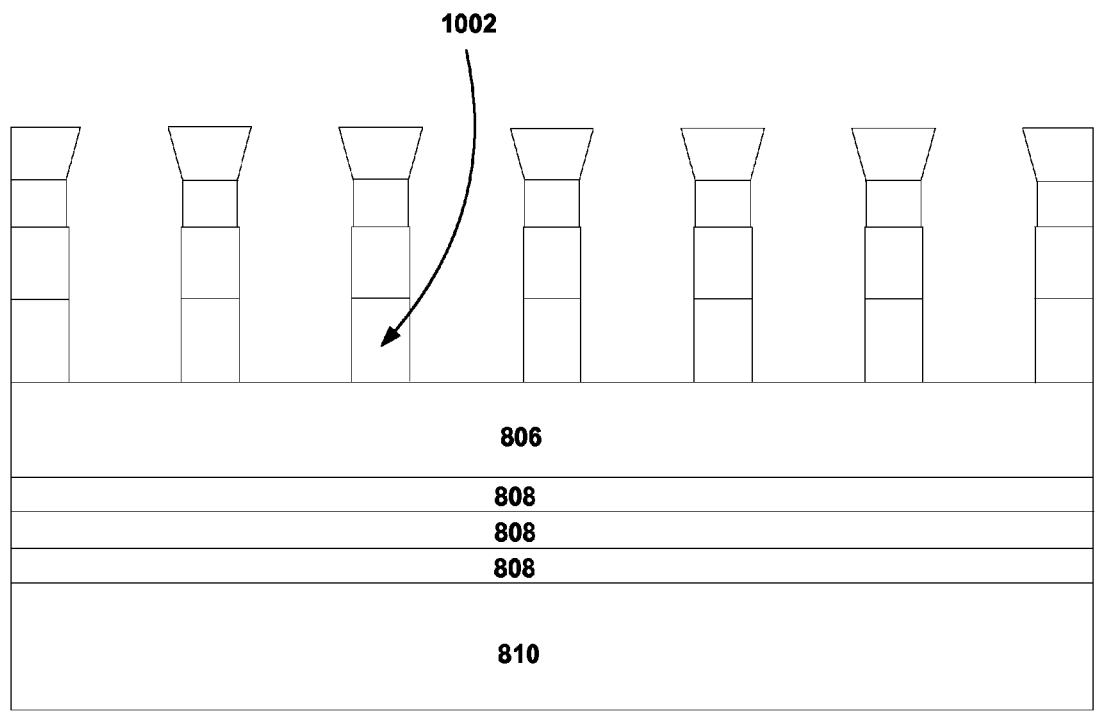
FIG. 10 is a schematic diagram of a disk in a manufacturing process in accordance with embodiments of the present invention.

Reference will now be made to FIG. 10, a schematic diagram of a cross sectional view of a disk in a manufacturing process in accordance with embodiments of the present invention. It should be appreciated that the disk in FIG. 10 is depicted at a later processing step than what is depicted in FIG. 9. FIG. 10 depicts hard mask layer 804 after it has been etched. In one embodiment, only portions of hard mask layer 804 that are exposed are etched all the way through hard mask layer 804 to expose portions of magnetic media 806. For example, portions of hard mask layer 804 that are covered by 502 and 504, such as remaining portion 1002, are not etched. In one embodiment, hard mask layer 804 is etched with an oxygen based RIE or a hydrogen-argon based RIE. In one embodiment, the etch of hard mask layer 804 is highly anisotropic to obtain sidewalls of 1002 etched through hard mask layer 804 that are as close to vertical as possible where vertical is defined as a perpendicular to the surface of hard mask layer 804 in contact with magnetic media 806.

Figure 11:
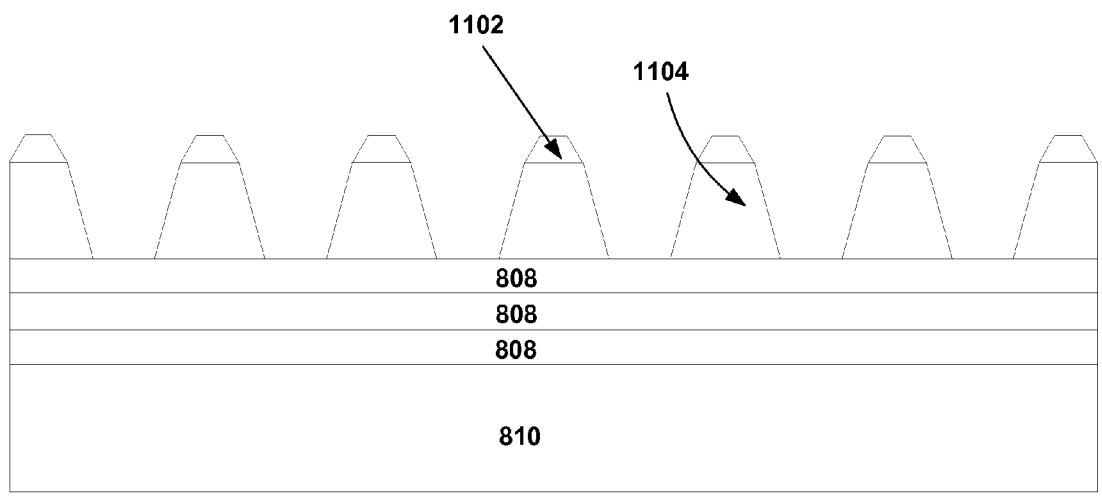
FIG. 11 is a schematic diagram of a disk in a manufacturing process in accordance with embodiments of the present invention.

Reference will now be made to FIG. 11, a schematic diagram of a cross sectional view of a disk in a manufacturing process in accordance with embodiments of the present invention. It should be appreciated that the disk in FIG. 11 is depicted at a later processing step than what is depicted in FIG. 10. FIG. 11 depicts magnetic media 806 after it has been etched. In one embodiment, the etching of magnetic media 806 is accomplished using Ar ion milling or Ar sputter etch. In one embodiment, the etch of magnetic media 806 etches through more than one layer of magnetic media. The etch of magnetic media 806 may or may not penetrate completely through magnetic media 806 to expose portions of various under layers 808.

In one embodiment, the remaining mask 502 and any residual resist 504 are etched away in the etch of magnetic media 806, along with any remaining portions of transfer layer 802 such as remaining portion 902. In one embodiment, only a portion of the remaining hard mask layer 804 is eroded away during the etch of magnetic media 806. For example, 1002 of FIG. 10 is eroded to 1102. If the remaining mask 502 or residual resist 504 are not removed during the magnetic media etch, additional process steps, such as RIE steps, may be included to remove them.

In one embodiment, the etch of magnetic media 806 creates portions of magnetic media that protrude from the surface of various under layers 808 such as protrusion 1104. In one embodiment, 10-15 nm of magnetic media 806 are etched.

Figure 12:
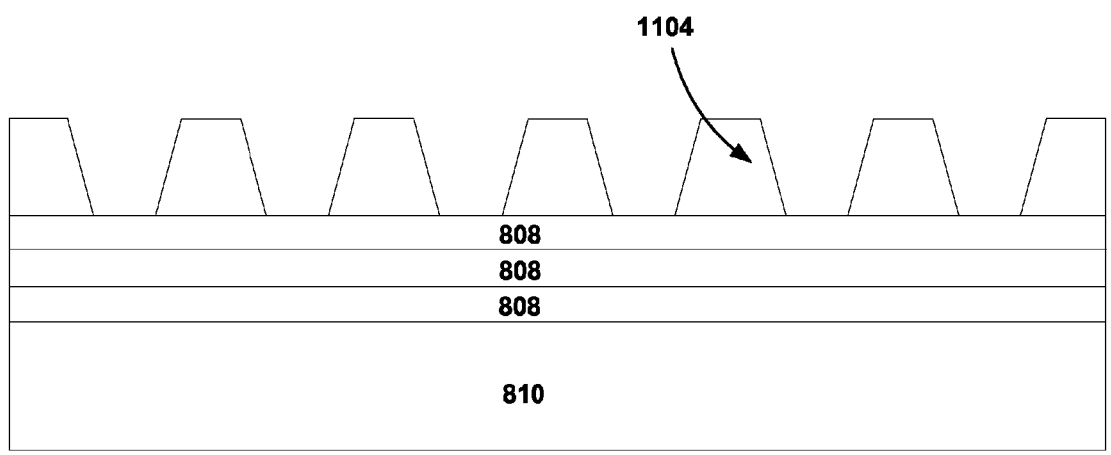
FIG. 12 is a schematic diagram of a disk in a manufacturing process in accordance with embodiments of the present invention.

Reference will now be made to FIG. 12, a schematic diagram of a cross sectional view of a disk in a manufacturing process in accordance with embodiments of the present invention. It should be appreciated that the disk in FIG. 12 is depicted at a later processing step than what is depicted in FIG. 11. FIG. 12 depicts magnetic media 806 after it has been stripped of any remaining portions of hard mask layer 804 such as 1102. In one embodiment, this stripping is accomplished using a hydrogen-argon based RIE or an oxygen based RIE.

Figure 13:
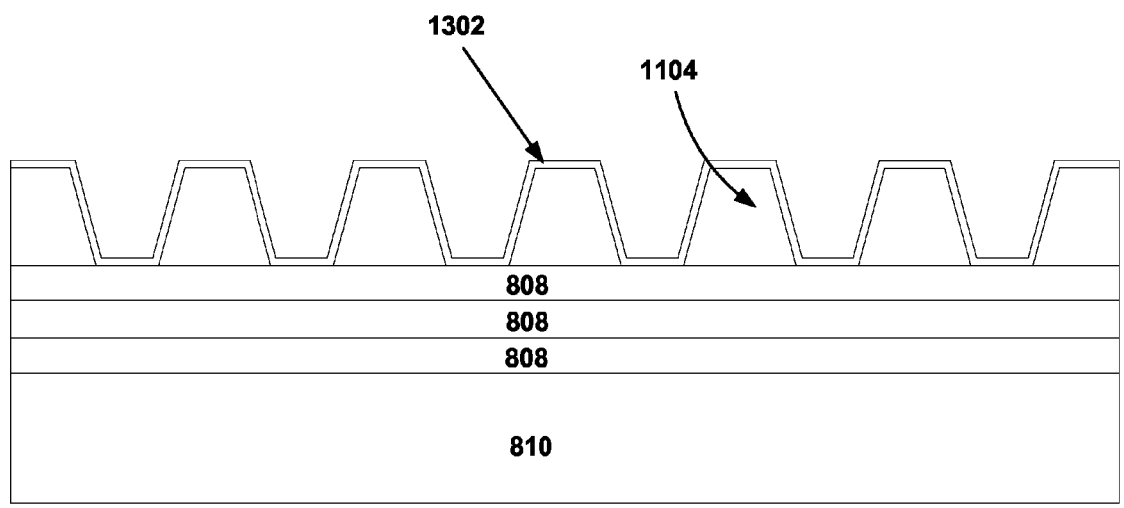
FIG. 13 is a schematic diagram of a disk in a manufacturing process in accordance with embodiments of the present invention.

Reference will now be made to FIG. 13, a schematic diagram of a cross sectional view of a disk in a manufacturing process in accordance with embodiments of the present invention. It should be appreciated that the disk in FIG. 13 is depicted at a later processing step than what is depicted in FIG. 12. FIG. 13 depicts portions of magnetic media 806, such as 1104 that have been coated over by overcoat 1302. In one embodiment, overcoat 1302 is a thin carbon overcoat that is applied via sputtering.

Figure 14:
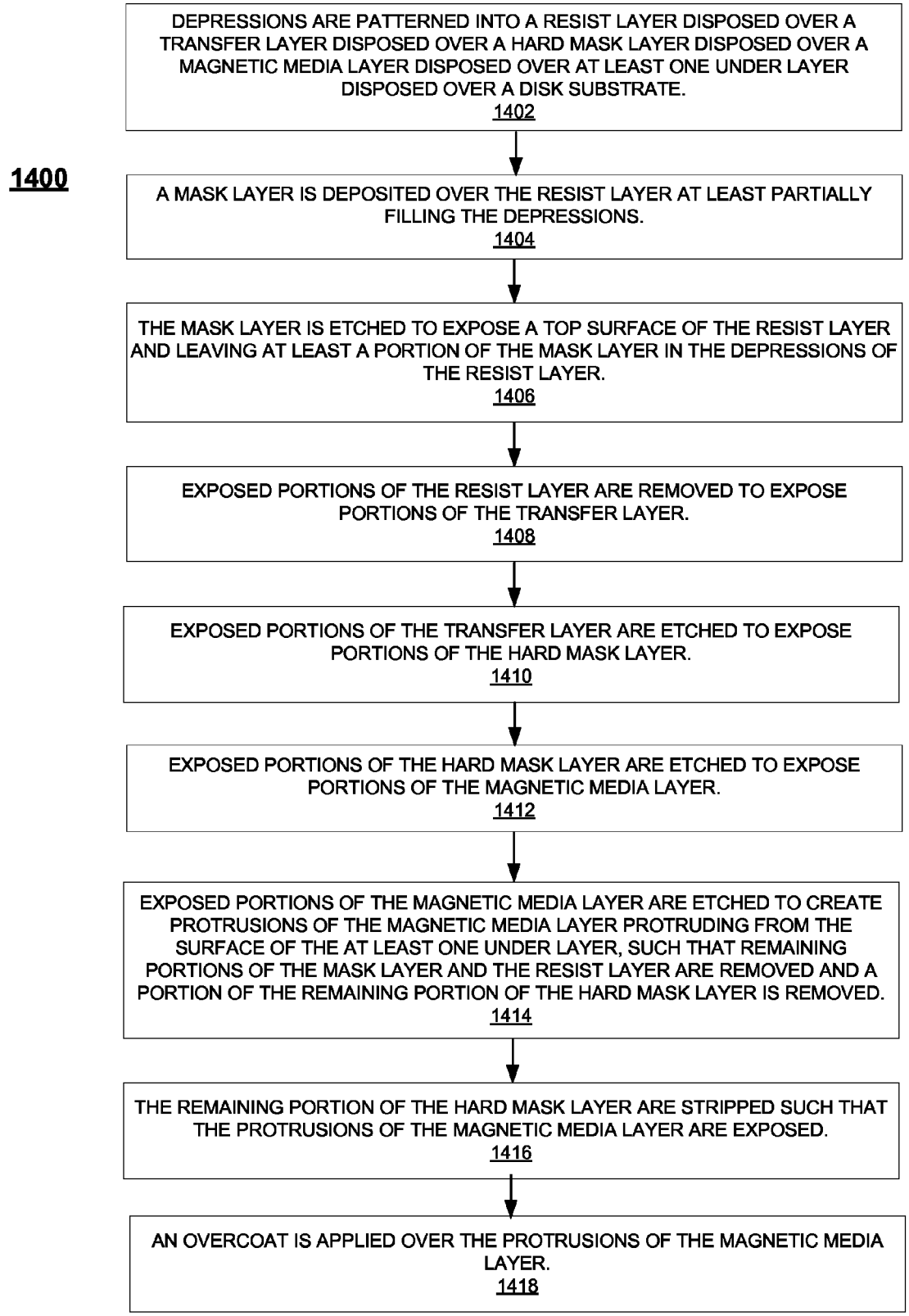
FIG. 14 is a flow chart of a method for patterning a substrate in accordance with embodiments of the present invention.

FIG. 14 is a flowchart illustrating process 1400 for patterning a media, in accordance with one embodiment of the present technology. Process 1400 and it steps are depicted in FIGS. 2A, 2B, 3, 4A, 4B, 5, 8, 9, 10, 11, 12, and 13. The substrate patterned by Process 1400 may be a media such as a disk in a HDD such as the HDD depicted in FIG. 1.

It At 1402, depressions are patterned into a resist layer disposed over a transfer layer disposed over a hard mask layer disposed over a magnetic media layer disposed over at least one under layer disposed over a disk substrate. For example, FIG. 2A depicts a patterned resist layer 204. FIG. 2A depicts one embodiment of the patterned resist layer after step 1402 has occurred. In one embodiment, the transfer layer, the hard mask layer, the magnetic media layer, and the disk substrate are depicted by FIG. 8.

At 1404, a mask layer is deposited over the resist layer at least partially filling the depressions. The mask layer may be mask layer 302 of FIG. 3. FIG. 3 depicts one embodiment after step 1404 has occurred.

At 1406, the mask layer is etched to expose a top surface of the resist layer and leaving at least a portion of the mask layer in the depressions of the resist layer. In one embodiment, FIG. 4A depicts the top surface of the resist layer at top surface 404 and the portion of the mask layer in the depressions at thickness 402. FIG. 4A depicts one embodiment after step 1406 has occurred.

At 1408, exposed portions of the resist layer are removed to expose portions of the transfer layer. In one embodiment, FIG. 8 depicts the exposed portions of the transfer layer 802. FIG. 8 depicts one embodiment after step 1408 has occurred.

At 1410, exposed portions of the transfer layer are etched to expose portions of the hard mask layer. In one embodiment, FIG. 9 depicts the etched portions of the transfer layer at remaining portion 902 and the exposed portions of the hard mask layer 804. FIG. 9 depicts one embodiment after step 1410 has occurred.

At 1412, exposed portions of the hard mask layer are etched to expose portions of the magnetic media layer. In one embodiment, FIG. 10 depicts the etched portions of the hard mask layer at remaining portion 1002 and the exposed portions of the magnetic media 806. FIG. 10 depicts one embodiment after step 1412 has occurred.

At 1414, exposed portions of the magnetic media layer are etched to create protrusions of the magnetic media layer protruding from the surface of the at least one under layer, such that remaining portions of the mask layer and the resist layer are removed and a portion of the remaining portion of the hard mask layer is removed. In one embodiment, FIG. 11 depicts the etched portions of the magnetic media at protrusion 1104 and the eroded portions of the hard mask layer 1102. FIG. 11 depicts one embodiment after step 1414 has occurred.

At 1416, the remaining portion of the hard mask layer are stripped such that the protrusions of the magnetic media layer are exposed. In one embodiment, FIG. 12 depicts the magnetic media at protrusion 1104 after the remaining hard mask layer is stripped away. FIG. 12 depicts one embodiment after step 1416 has occurred.

At 1418, an overcoat is applied over the protrusions of the magnetic media layer. In one embodiment, FIG. 13 depicts the overcoat 1302. FIG. 13 depicts one embodiment after step 1418 has occurred.

Example embodiments of the present technology are thus described. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims. Additionally, in various embodiments of the present technology, the steps and methods described herein do not need to be carried out in the order specified, nor do all steps need to be carried out to accomplish the purposes of the technology.

What is claimed:

1. A method for patterning a substrate, said method comprising:
    patterning depressions into a resist layer over a substrate;
    depositing a mask layer over said resist layer at least partially filling said depressions;
    etching said mask layer to expose a top surface of said resist layer and leaving at least a portion of said mask layer in said depressions of said resist layer, wherein said mask layer over said top surface of said resist layer is etched at a faster rate than said mask layer in said depressions of said resist layer;
    removing exposed portions of said resist layer to expose portions of said substrate, wherein said at least a portion of said mask layer is undercut leaving a top surface wider than a bottom surface; and
    etching into exposed portions of said substrate.

2. The method as recited in claim 1 wherein said etching said mask layer is accomplished via an etching species emitted from a source, said source positioned so that said etching species travels in a direction that is substantially perpendicular to said top surface of said resist layer.

3. The method as recited in claim 1 wherein said substrate is a media for use in a hard disk drive.

4. The method as recited in claim 1 wherein said depositing said mask layer over said resist layer is deposited by a collimated deposition.

5. The method as recited in claim 1 wherein said mask layer is a reactive ion etchable mask layer.

6. The method as recited in claim 1 wherein said patterning said depressions into said resist layer is accomplished using a technique wherein said technique is selected from the group of techniques consisting of: photon-based lithography, nano-imprint lithography, electron beam lithography, and block copolymer self-assembly.

7. The method as recited in claim 1 wherein said faster rate is caused by a microloading effect.

8. The method as recited in claim 1 wherein said patterning said depressions into said resist layer results in a residual layer of said resist layer over said substrate.

9. The method as recited in claim 1 wherein said patterning said depressions into said resist layer results in no residual layer of said resist layer over said substrate.

10. The method as recited in claim 1 wherein said depositing said mask layer over said resist layer results in a substantially uniform thickness of said mask layer over said top surface of said resist layer and said mask layer partially filling said depressions.

11. The method as recited in claim 1 wherein said depositing said mask layer over said resist layer deposits said mask layer over sidewalls of said depressions.

12. The method as recited in claim 1 wherein said depressions are patterned with an angled sidewall relative to a surface of said substrate in contact with said resist layer.

13. The method as recited in claim 1 wherein said etching said mask layer to expose said top surface of said resist layer is accomplished using an etch wherein said etch is selected from the group of etches consisting of: a chlorine based reactive ion etch (RIE), a fluorine based RIE, a methanol based RIE, ion milling and physical sputtering.

14. The method as recited in claim 1 wherein said etching into exposed portions of said substrate results in protrusions of said substrate protruding from an etched surface of said substrate.

15. A method for patterning a media, said method comprising:
    patterning depressions into a resist layer disposed over a transfer layer disposed over a hard mask layer disposed over a magnetic media layer disposed over at least one under layer disposed over a disk substrate;
    depositing a mask layer over said resist layer at least partially filling said depressions;
    etching said mask layer to expose a top surface of said resist layer and leaving at least a portion of said mask layer in said depressions of said resist layer;
    removing exposed portions of said resist layer to expose portions of said transfer layer, wherein said at least a portion of said mask layer is undercut leaving a top surface wider than a bottom surface;
    etching exposed portions of said transfer layer to expose portions of said hard mask layer;
    etching exposed portions of said hard mask layer to expose portions of said magnetic media layer;
    etching exposed portions of said magnetic media layer to create protrusions of said magnetic media layer protruding from the surface of said at least one under layer, such that remaining portions of said mask layer and said resist layer are removed and a portion of the remaining portion of said hard mask layer is removed;

stripping the remaining portion of said hard mask layer such that said protrusions of said magnetic media layer are exposed; and applying an overcoat over said protrusions of said magnetic media layer.

16. The method as recited in claim 15 wherein said patterning said depressions into said resist layer is accomplished using a technique wherein said technique is selected from the group of techniques consisting of: photon-based lithography, nano-imprint lithography, electron beam lithography, and block copolymer self-assembly.

17. The method as recited in claim 15 wherein said depressions are patterned with an angled sidewall relative to a surface of said disk substrate in contact with said resist layer.

18. The method as recited in claim 15 wherein said mask layer over said top surface of said resist layer is etched at a faster rate than said mask layer in said depressions of said resist layer.

19. The method as recited in claim 18 wherein said faster rate is caused by a microloading effect.

\* \* \* \* \*